US009252272B2

(12) United States Patent
Liu et al.

(10) Patent No.: US 9,252,272 B2
(45) Date of Patent: Feb. 2, 2016

(54) FINFET SEMICONDUCTOR DEVICE HAVING LOCAL BURIED OXIDE

(71) Applicant: GLOBALFOUNDRIES Inc., Grand Cayman (KY)

(72) Inventors: Yanxiang Liu, Glenville, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/083,164

(22) Filed: Nov. 18, 2013

(65) Prior Publication Data

US 2015/0137235 A1 May 21, 2015

(51) Int. Cl.
| | | |
|---|---|---|
| H01L 27/12 | (2006.01) | |
| H01L 29/78 | (2006.01) | |
| H01L 29/66 | (2006.01) | |

(52) U.S. Cl.
CPC ........ *H01L 29/785* (2013.01); *H01L 29/66795* (2013.01); *H01L 29/7849* (2013.01)

(58) Field of Classification Search
CPC ............ H01L 29/785; H01L 29/66795; H01L 29/7849
See application file for complete search history.

(56) References Cited

U.S. PATENT DOCUMENTS

| | | | |
|---|---|---|---|
| 5,061,642 A | | 10/1991 | Fujioka |
| 5,888,297 A | | 3/1999 | Ogura |
| 6,420,218 B1 | * | 7/2002 | Yu .................................. 438/142 |
| 8,273,626 B2 | * | 9/2012 | Hareland .......... H01L 29/42384 257/E21.415 |
| 8,445,337 B2 | | 5/2013 | Bangsaruntip et al. |
| 8,445,963 B2 | | 5/2013 | Jakschik et al. |
| 8,461,647 B2 | | 6/2013 | Chou et al. |
| 8,469,886 B2 | | 6/2013 | Brauker et al. |
| 8,482,069 B2 | | 7/2013 | Yamazaki et al. |
| 8,486,736 B2 | | 7/2013 | Yokoyama et al. |
| 8,507,989 B2 | | 8/2013 | Khakifirooz et al. |
| 8,517,275 B2 | | 8/2013 | Tsuchiya |
| 8,519,479 B2 | | 8/2013 | Bangsaruntip |
| 8,531,000 B2 | | 9/2013 | Yoneda |
| 8,536,650 B2 | | 9/2013 | Cheng et al. |
| 8,546,246 B2 | | 10/2013 | Lin et al. |
| 8,551,313 B2 | | 10/2013 | Basker et al. |
| 8,558,370 B2 | | 10/2013 | Sugiyama et al. |
| 8,564,025 B2 | | 10/2013 | Bangsaruntip et al. |
| 8,574,970 B2 | | 11/2013 | Cheng et al. |
| 8,575,694 B2 | | 11/2013 | Huo et al. |
| 8,575,699 B2 | | 11/2013 | Chan et al. |
| 8,610,201 B1 | * | 12/2013 | Hokazono ....... H01L 21/823821 257/328 |
| 9,153,309 B2 | * | 10/2015 | Widjaja ............... G11C 11/404 1/1 |
| 2005/0280090 A1 | * | 12/2005 | Anderson ............. H01L 29/785 257/347 |

(Continued)

OTHER PUBLICATIONS

USPTO Office Action dated Aug. 14, 2014; For Co-Owned U.S. Appl. No. 13/943,849.

(Continued)

*Primary Examiner* — A. Sefer

(74) *Attorney, Agent, or Firm* — Heslin Rothenberg Farley & Mesiti P.C.; Nicholas Mesiti, Esq.

(57) ABSTRACT

There is set forth herein in one embodiment a FinFET semiconductor device having a fin extending from a bulk silicon substrate, wherein there is formed wrapped around a portion of the fin a gate, and wherein proximate a channel area of the fin aligned to the gate there is formed a local buried oxide region aligned to the gate. In one embodiment, the local buried oxide region is formed below a channel area of the fin.

20 Claims, 8 Drawing Sheets

(56) References Cited

U.S. PATENT DOCUMENTS

| | | | |
|---|---|---|---|
| 2006/0027870 A1* | 2/2006 | Inaba | 257/353 |
| 2006/0084215 A1* | 4/2006 | Hieda et al. | 438/197 |
| 2007/0122984 A1* | 5/2007 | Zhu et al. | 438/285 |
| 2008/0135935 A1* | 6/2008 | Cho et al. | 257/347 |
| 2008/0237655 A1* | 10/2008 | Nakabayashi et al. | 257/255 |
| 2009/0014795 A1* | 1/2009 | Koh | H01L 29/785 257/347 |
| 2009/0224321 A1* | 9/2009 | Tsuchiya | 257/351 |
| 2011/0084315 A1* | 4/2011 | Bedell et al. | 257/213 |
| 2012/0061759 A1* | 3/2012 | Cheng et al. | 257/347 |
| 2012/0104498 A1* | 5/2012 | Majumdar et al. | 257/351 |
| 2013/0119466 A1 | 5/2013 | Chung et al. | |
| 2013/0122665 A1 | 5/2013 | Chan et al. | |
| 2013/0127049 A1 | 5/2013 | Wang et al. | |
| 2013/0140639 A1 | 6/2013 | Shieh et al. | |
| 2013/0146953 A1 | 6/2013 | Cheng et al. | |
| 2013/0146959 A1 | 6/2013 | Cheng et al. | |
| 2013/0149823 A1 | 6/2013 | Bedell et al. | |
| 2013/0155382 A1 | 6/2013 | Inoue | |
| 2013/0193916 A1 | 8/2013 | Koyama | |
| 2013/0200438 A1 | 8/2013 | Liu et al. | |
| 2013/0207187 A1 | 8/2013 | Huo et al. | |
| 2013/0260505 A1 | 10/2013 | Bedell et al. | |
| 2013/0270640 A1 | 10/2013 | Sagae et al. | |
| 2013/0320294 A1* | 12/2013 | Cappellani et al. | 257/9 |
| 2014/0167163 A1* | 6/2014 | Cheng et al. | 257/347 |
| 2014/0264596 A1* | 9/2014 | He et al. | 257/347 |
| 2014/0361338 A1* | 12/2014 | Kerber et al. | 257/192 |
| 2015/0102428 A1* | 4/2015 | Adam | H01L 29/16 257/410 |

OTHER PUBLICATIONS

Liu et al., "Semiconductor Device Having Local Buried Oxide", U.S. Appl. No. 13/943,849, filed Jul. 17, 2013, 22 pages.
Jan. 14, 2015 Final Office Action in U.S. Appl. No. 13/943,849.
Apr. 7, 2015 Advisory Action in U.S. Appl. No. 13/943,849.
Jul. 7, 2015 Advisory Action in U.S. Appl. No. 13/943,849.
Co-Owned U.S. Appl. No. 13/943,849 filed Jul. 17, 2013, USPTO File History Record (Communications from applicant and to applicant, from Jul. 17, 2013 through Jul. 7, 2015).

* cited by examiner ially pointed out and distinctly claimed as examples in the
FINFET SEMICONDUCTOR DEVICE HAVING LOCAL BURIED OXIDE

FIELD OF THE INVENTION

Background of the Invention

Extremely thin Silicon-On-Insulator (ETSOI) planar Metal Oxide Silicon Field Effect Transistors (MOSFETs) are desirable for many aspects. Such structures provide fully depleted devices having planar architectures with superior short channel control, low junction leakage current, and an un-doped body with low variability from random dopant fluctuations. Thin body semiconductor devices have limitations, however, in that they are not well adapted for stress inducement in the channel (or body) for carrier mobility enhancement. Also, source/drain resistance tends to be too high due to thin Silicon (Si) layer (i.e., small amount of Si materials) for many applications.

In one proposed solution for inducing stress to a channel and reducing source/drain resistance, the structure of raised sources and drains can be formed using Si epitaxial growth. However, the added stress in a channel of a MOSFET on ETSOI by using such methods can still be minimal and the source and drain resistance is still too high for many applications which typically employ MOSFETs formed on a bulk Si substrate.

In contrast to traditional planar metal-oxide-semiconductor, field-effect transistors (MOSFETs), which are fabricated using conventional lithographic fabrication methods, non-planar FETs incorporate various vertical transistor structures. One such semiconductor structure is the "FinFET", which takes its name from the multiple semiconductor "fins" that are used to form the respective gate channel with small footprint. Advantageously, the fin structure helps to control current leakage through the transistor in the off state, and a double gate or tri-gate structure may be employed to control short channel effects.

BRIEF SUMMARY

There is set forth herein in one embodiment a FinFET semiconductor device having a fin extending from a bulk silicon substrate, wherein there is formed wrapped around a portion of the fin a gate, and wherein proximate a channel area of the fin aligned to the gate there is formed a local buried oxide region aligned to the gate. In one embodiment, the local buried oxide region is formed below a channel area of the fin.

BRIEF DESCRIPTION OF SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
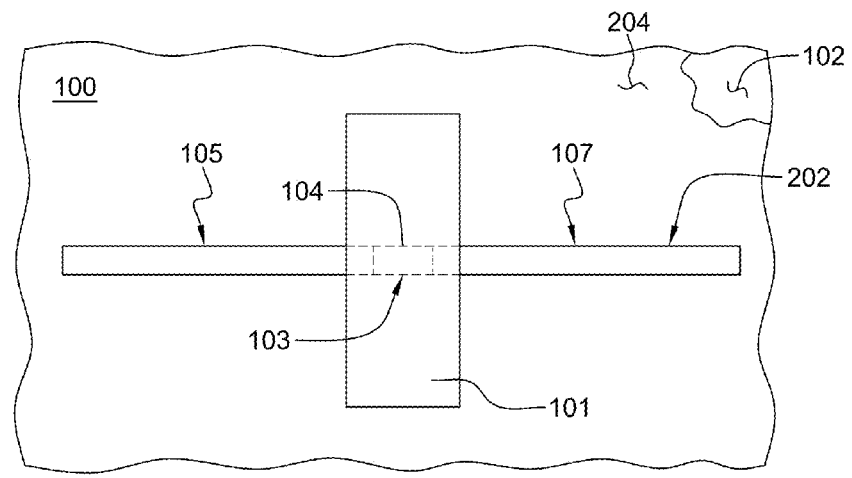
FIG. 1 is a top view of a FinFET semiconductor device having a local buried oxide region.
Figure 2:
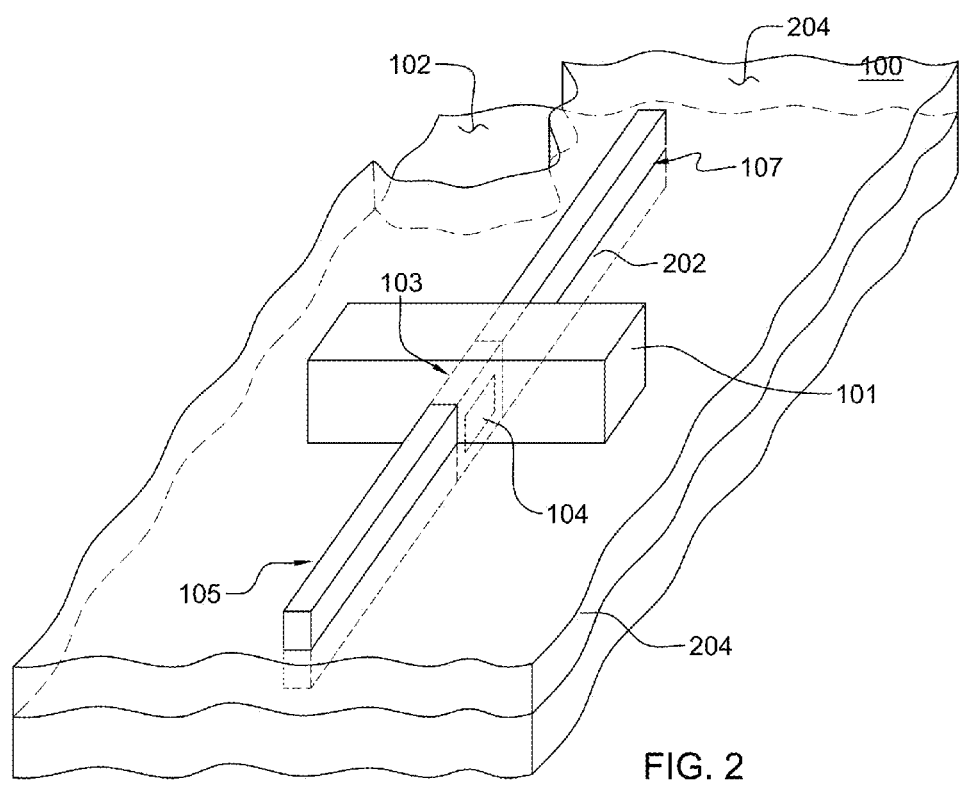
FIG. 2 is a perspective view of a FinFET semiconductor device having a local buried oxide region.

There is set forth herein, as depicted in FIGS. 1 and 2, a fin field effect transistor (FinFET) semiconductor device 100 having a fin 202 extending from a bulk silicon substrate 102, wherein there is formed wrapped around a portion of the fin 202 a gate 101, and wherein proximate a channel area 103 of the fin aligned to the gate 101 there is formed a local buried oxide region 104. Between substrate 102 and gate 101 there can be disposed oxide 204 (oxide layer 204). Oxide 204 can be disposed in surrounding relation to a lower elevation portion of fin 202. Shown as having a single fin in the embodiment of FIGS. 1 and 2, semiconductor device 100 can have more than one fin. In one embodiment, semiconductor device 100 can be provided by bulk wafer defining a plurality of field effect transistors. In one embodiment, semiconductor device 100 can be provided by an integrated circuit (IC) defining a plurality of field effect transistors.

FIGS. 1 and 2 show a top plan view and isometric view, respectively, of a FinFET semiconductor device 100 fabricated on Si substrate 102. Though only one fin is illustrated in FIG. 1 for simplicity, there can be multiple fins 202 fabricated in parallel with fin 202. Fin 202 can extend upwardly from substrate 102. Each fin 202 of a semiconductor device 100 can be elongated and can include a rectangular cross section as depicted in the views of FIGS. 2-12 herein. In the embodiment illustrated, FinFET semiconductor device 100 includes a gate 101 which can be wrapped around the top and sides of a fin 202. A source 105 is defined at one end of fin 202, and a drain 107 is defined at the other end of fin 202. Source 105 and drain 107 can be defined on fin 202 and doped by performing appropriate implantation processes. Appropriate implantation processes can include e.g., implantation of dopants (n-type or p-type) for n-type and p-type source and drain of FinFETs. A channel 103 can be defined by fin 202 intermediate source 105 and drain 107 at a region of fin 202 covered by gate 101 and aligned to gate 101. Channel 103 can be defined in the fin 202 above local buried oxide region 104, the channel 103 having a first end and a second end, a source 105 defined at the first end of the channel 103 and a drain 105 defined at the second end of the channel 103. In one aspect as set forth herein, channel 103 can be delimited by a local buried oxide region 104 below the top surface of fin 202 by a distance in one embodiment of between about 20 nm and 40 nm (this distance being the height of the fin portion that extends above local buried oxide region 104 being referred to as the active fin height). Therefore, in one embodiment, current can only flow through the portion of the channel of fin 202 above local buried oxide region 104.

Gate 101 in one embodiment can have a gate stack having multiple layers. The multiple layers can include one or more metal layers and one or more dielectric layers. The one or more metal layers can have, e.g., one or more layers of titanium nitride (TiN), TiAlC, TaN, aluminum (Al), or tungsten (W). The one or more dielectric layers can have, e.g., one or more of Si-oxide, Si-nitride, or high-k material (e.g., Hfoxide). Because gate 101 can have have multiple layers, gate 101 can be referred to a gate stack.

As shown in FIG. 1, a semiconductor device 100 can include a local buried oxide region 104 aligned with a gate 101. A channel 103 can be defined that is aligned with gate 101 and which can be above local buried oxide region 104. Local buried oxide region 104 can be referred to as "BOX". Local buried oxide region 104 can be formed in one or more of bulk Si substrate 102 and fin 202 by implantation of oxygen into fin 202 followed by annealing. In the embodiments depicted in FIGS. 1-15 herein, local buried oxide region 104 is formed in fin 202 to define a channel 103 above local buried oxide region 104 and an area of fin 202 below local buried oxide region 104. BOX 104 can be aligned to gate 101 and can have a length less than a length of gate 101 as depicted in FIGS. 1 and 2. BOX 104 can be adapted so that BOX 104 blocks a leakage current path between source 105 and drain 107.

Figure 3:
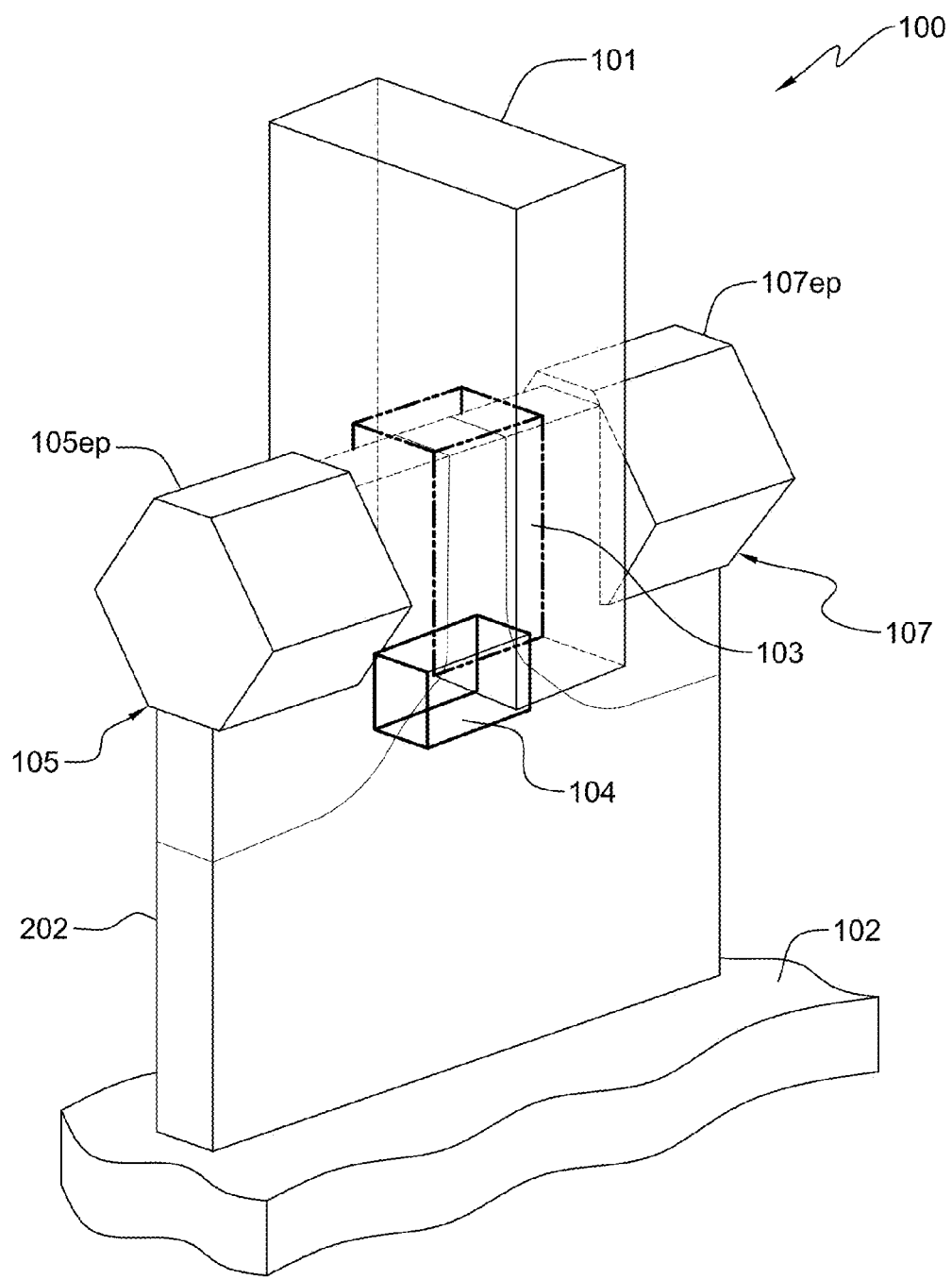
FIG. 3 is a perspective view of a FinFET semiconductor device having a local buried oxide region in another embodiment.

In FIG. 3 there is shown a perspective view of an alternative embodiment of device 100. The "active" channel 103 is above the local buried oxide region 104. The area of fin 202 below the local buried oxide region 104 can provide mechanical stability to the substrate. Thus, the location of local buried oxide region 104 can be adjusted toward the surface of Si substrate 102, or even half way (e.g., as depicted in the embodiment illustrated in FIG. 15) or mostly submerged into the Si-substrate, so that the active fin channel height is larger to define a stronger FinFET device 100.

Figure 4:
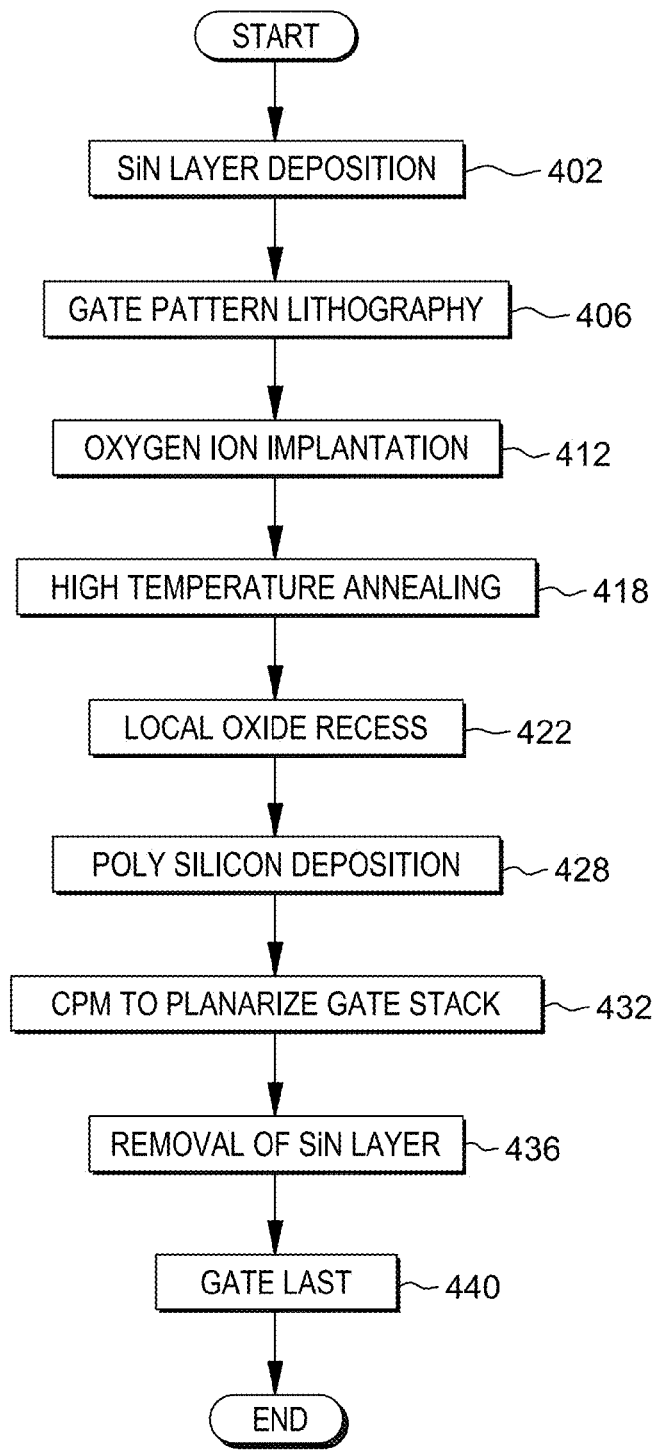
FIG. 4 is a flow diagram illustrating a method including forming a local buried oxide region in a FinFET semiconductor device.
Figure 11:
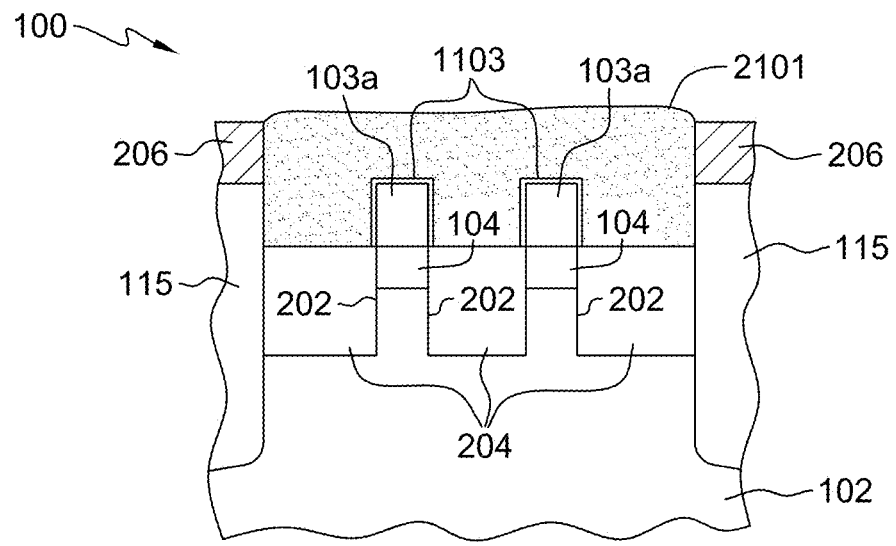
Figure 12:
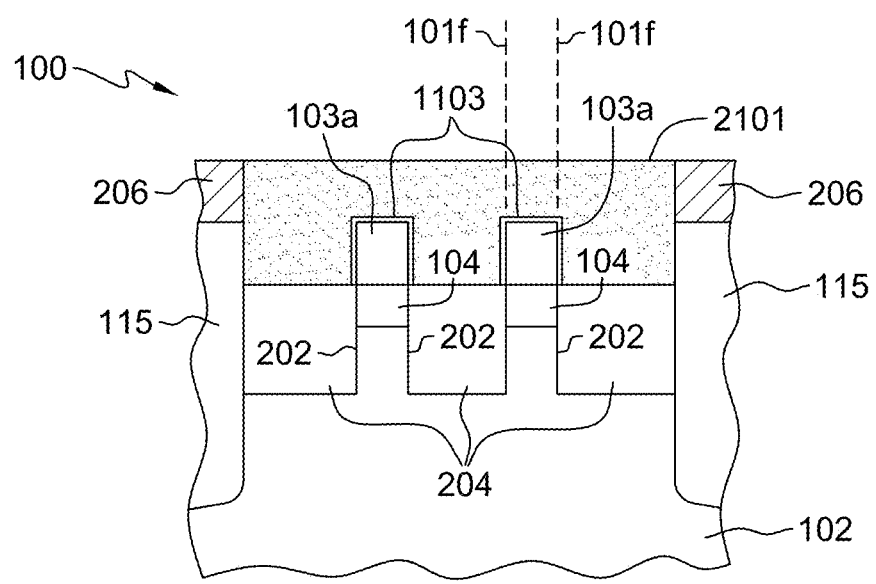
Figure 13:
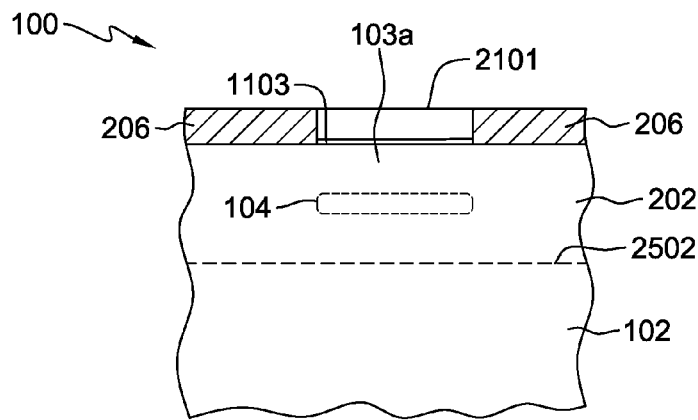
FIGS. 13 and 14 are fin lengthwise cross sectional side view schematic diagrams illustrating a semiconductor device.
Figure 14:
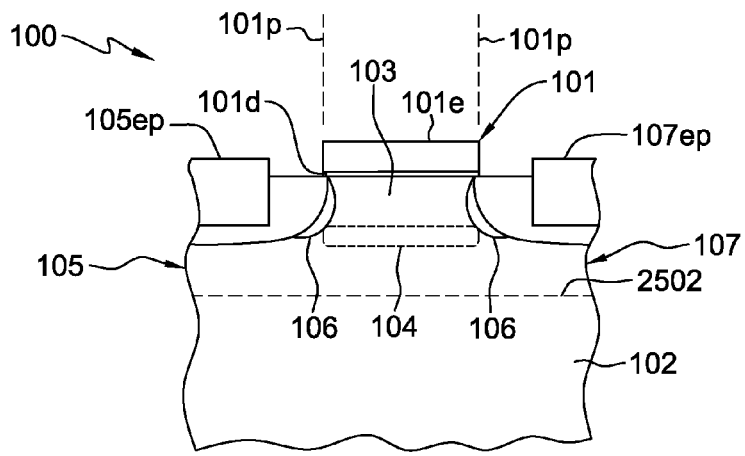

An exemplary method for making a FinFET semiconductor device 100 having a local buried oxide region 104 is set forth in the flow diagram of FIG. 4 in connection with FIGS. 5-14. FIGS. 5-12 illustrate cross-sectional views of a fin 202 perpendicular to the fin direction (widthwise) and parallel and through the gate 101. FIGS. 13-14 are cross-sectional views co-extensive with the fin direction (lengthwise) through gate 101. In the views of FIGS. 5-12, two fins are illustrated.

Figure 5:
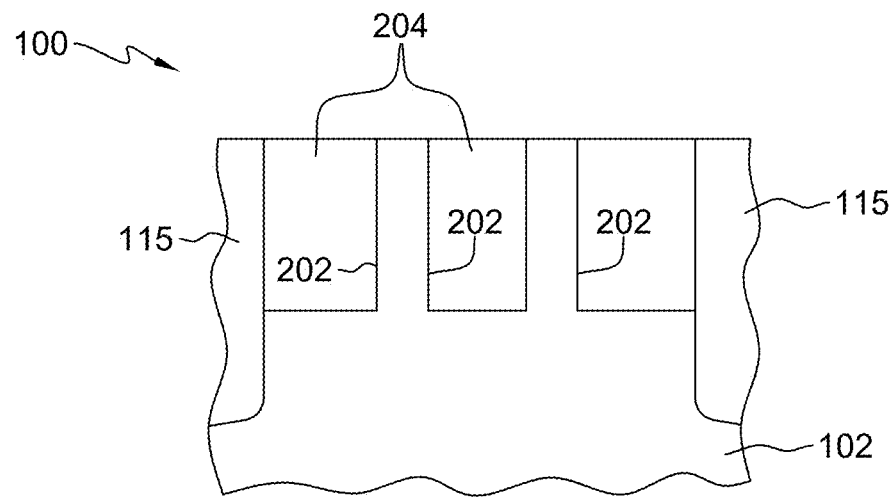
FIGS. 5-12 are fin widthwise cross sectional side view schematic diagrams illustrating fabrication of a FinFET semiconductor device having a local buried oxide region.
Figure 6:
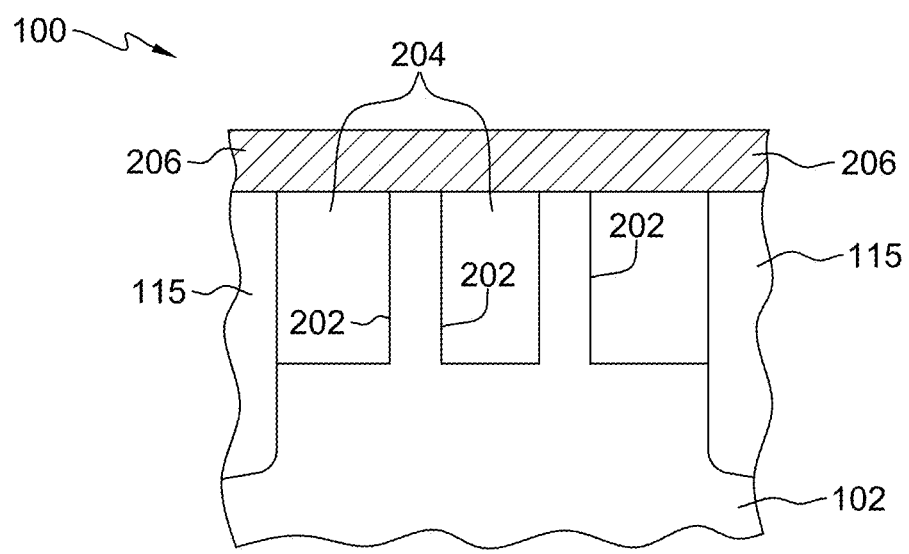

At block 402 (FIG. 4), as depicted in FIGS. 5 and 6, there can be performed SiN layer deposition. For performance of the SiN layer deposition at block 402 there can be provided a bulk substrate 102 having fins 202 and oxide 204 (oxide layer 204). At block 402 in reference to FIG. 5 the providing can include providing a substrate 102, forming fins 202 and filling oxide 204 between fin 202 and depositing thereon an insulation layer 206. Performance of insulation layer deposition at block 402 can be accompanied by chemical-mechanical planarization (CMP) to provide a flat surface to improve efficiently and accuracy of ensuing gate pattern lithography processes. In one embodiment, the insulation layer 206 can be e.g., a silicon nitride (SiN) layer as depicted in FIG. 6. Insulation layer 206, which can be provided by SiN, can serve as a hard mask. The providing at block 402 can alternatively include providing a Si substrate having fins 202 and filled oxide 204 and depositing thereon insulation layer 206 in other form, e.g., a Si-oxide layer or a combination of Si-nitride and Si-oxide layers. The thickness of the insulation layer 206 can be in the range of about 10 nm to about 100 nm. The providing at block 402 can also include shallow trench isolation (STI) and formation. As indicated in FIG. 5, shallow trench isolation (STI) oxide 115 can be formed at block 402. As depicted in FIG. 5, STI oxide can be deposited into shallow trenches of Si substrate 102 to isolate sets of devices of semiconductor device 100. The shallow trenches that are filled with STI oxide in the views of FIGS. 4-12 are shown as having a depth greater than a depth of oxide 204 deposited adjacent to fins 202. In another embodiment shallow trenches filled with STI oxide 115 can have a depth less than a depth of oxide 204 deposited adjacent to fins 202. In another embodiment, shallow trenches filled with STI oxide can have a depth equal to a depth of oxide 204 deposited adjacent to fins 202. The depth of oxide 204 can be regarded as the depth of oxide 204 after recessing of oxide 204 at block 422 to be described herein. The providing of STI and formation at block 404 can also include providing shallow trench isolation (forming a trench with STI oxide 115) between fins 202 depicted in FIGS. 5-12. A depth of such intermediate trenches can be less than, greater than, or equal to a depth of trenches (filled with STI oxide 115) depicted in FIGS. 5-12.

Figure 7:
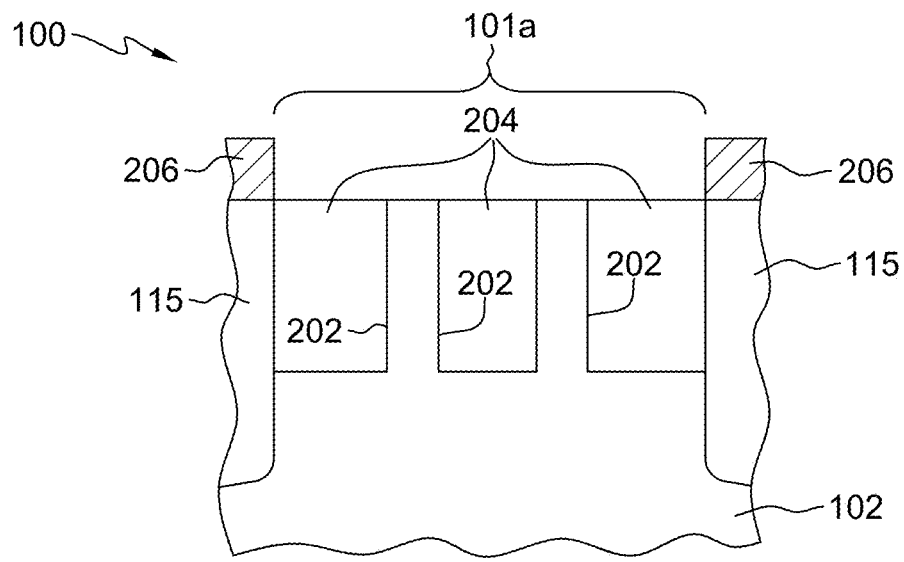

At block 406 (FIG. 4), as depicted at FIG. 7, there can be performed gate patterning lithography followed by gate reactive ion etching (RIE) to open the gate area 101a. There can be performed gate patterning for providing an opening in insulation layer 206 (to allow for oxygen ion implantation in subsequent step). Gate area 101a as depicted in FIG. 7 can be uncovered by photoresist. In one embodiment, the gate patterning can include providing a mask, the mask having a two dimensional area pattern that defines a gate area of device 100. Removal of the mask provided by insulation layer 206 can include, e.g., RIE or wet etching. For example, hot $H_3PO_4$ acid can be used to remove nitride 206 without damaging the Si fins 202 and filled oxide 204.

Figure 8:
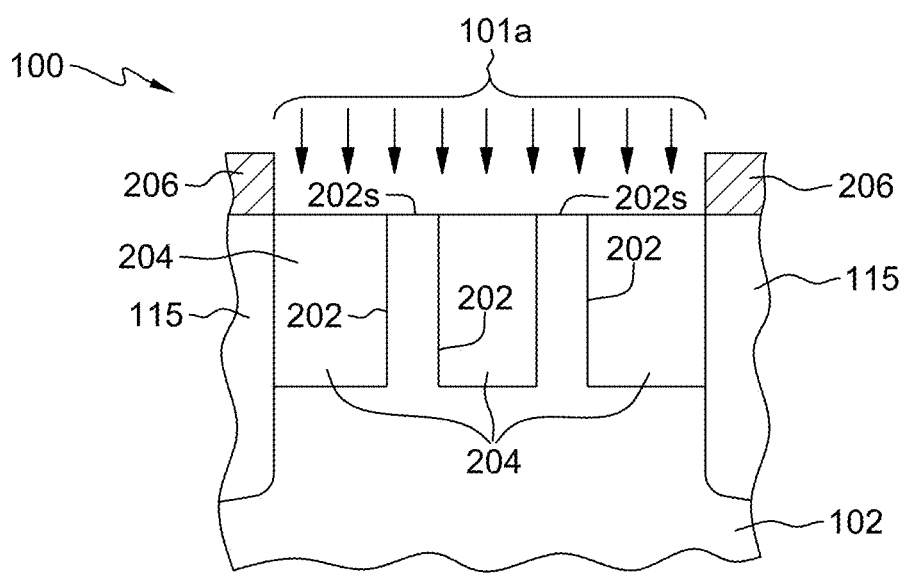

At block 412 (FIG. 4), as depicted in FIG. 8, there can be performed oxygen ion implantation into the exposed gate area 101a. There can be formed a local buried oxide region 104 (FIG. 9) in fins 202. Forming of a local buried oxide region 104 (FIG. 9) can be performed by using ion implantation of oxygen ($O^+$) through an exposed surface 202s of fin 202 into an area within fin 202 and followed by thermal annealing. By performing implantation of oxygen through a same opening defined by mask layer 206 used for gate patterning, a local buried oxide region 104 can be regarded as being "self aligned" to gate 101. Local buried oxide region 104 can be aligned to a gate 101. Local buried oxide region 104 can have a length in common with a length of gate 101. In addition or in the alternative, local buried oxide region 104 can have a width in common with width of gate 101. In one embodiment, local buried oxide region 104 can have one or more a length and width less than a length and width, respectively, of gate 101. In one embodiment, the implantation of oxygen ions can be accompanied by implantation of one or more of nitrogen (N), carbon (C) and fluorine (F). The energy and dose of implantation of one or more of oxygen ions, N, C, and F is designed to form a local buried oxide region 104 (BOX) deep enough underneath the a surface of fin 202, so that dopant diffusion is reduced and stress at local buried oxide region 104 and surrounding areas of fin 202 is reduced. The implant energy of O is in the range of from about 10 KeV to about 100 KeV. In one embodiment, the implant energy of O is in the range from about 200 KeV to about 1 MeV. In one embodiment, the local buried oxide region 104 (shown as formed in FIG. 9) can be formed at a location of between about 20 nm and about 40 nm beneath the surface 202s of fin 202 (i.e., a thin silicon layer having a thickness of from about 20 nm to about 40 nm as similar to the thin Si layer in an ETSOI for serving as the channel for a MOSFET). In one embodiment, the ion implantation can include implantation of oxygen (with dose in the range of $10^{15}$ to $10^{17}$ $cm^2$) and followed by implantation sequentially of nitrogen (N), carbon (C), or fluorine (F) with smaller dose (in the range of from about 1.0% to about 3.0% of the main O dose). In one embodiment, mask 206 defines both an area of implantation of oxygen ions, and in a manner set forth herein, a gate area 101a, an area of gate electrode material. With use of mask 206 a formed local buried oxide region 104 can be self aligned to a gate area 101a and accordingly can be self aligned to a formed gate 101 when gate 101 is formed. When local buried oxide region 104 is formed a channel area 103a can be formed on fin 202 above local buried oxide region 104.

According to one prior art method for the fabrication of a commercially available Silicon on Insulator (SOI) substrate, a method known as Separation by Implantation of Oxygen (SIMOX) can be employed. The SIMOX method performs oxygen implant into bulk Si-substrate in blank (i.e., no photoresist pattern) with high dose ($>10^{18}$ cm$^2$) and at elevated temperature ($>600°$ C.) during implantation and then followed by a post implant annealing at high temperature ($>1200°$ C.) to eliminate defects and re-crystallize the surface, so that a Si-On-Insulator (SOI) substrate is formed. In one method in this disclosure for the formation of a local buried oxide region 104, oxygen implant is performed in a localized area through a patterned mask 206 and with a lower dosage and no elevated temperature during implantation and also lower annealing temperature after implantation than in the case of a SIMOX for SOI substrate fabrication. According to one embodiment, the oxygen implantation for the formation of local buried oxide region 104 is at a dosage of about $10^{16}$ to $10^{17}$ ions/cm$^2$, which is about 1% to about 10% of the known blank implant of oxygen at elevated temperature in the SIMOX technology method for forming SOI substrate. In one embodiment, the implant energy of O can be <120 KeV (to achieve the formation of BOX 20-40 nm below the active fin). The post implant annealing temperature in this disclosure is in a range of from about 800° C. to about 1100° C. which is significantly lower than that for the referred to SIMOX process.

Figure 9:
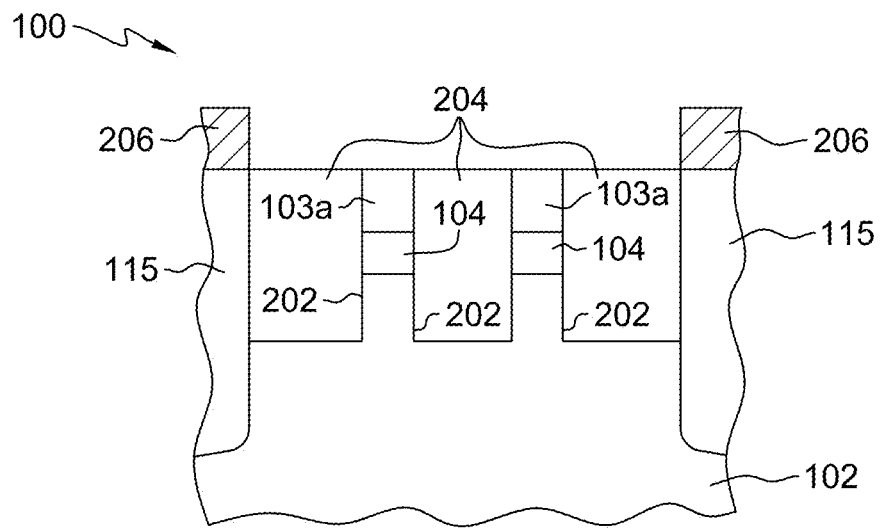

At block 416 (FIG. 4), as depicted in FIG. 9, there can be performed post implant high temperature annealing. High temperature annealing at block 416 can be performed subsequent to implantation of oxygen at block 412. The high temperature annealing can be performed e.g., at from about 800 deg. C. to about 1100 deg. C. in inert ambient to form a local buried oxide region 104 (BOX) and heal the damage in the silicon channel from the implantation at block 412. By comparison, post implantation annealing temperatures seen in SIMOX for SOI substrate fabrication processes are in the range of >1200 C. The implant of additives (N, C, F) with oxygen ions helps to suppress the generation of defects during post implant thermal annealing and also lower than the annealing temperature significantly. The implantation of the noted additives (N, C, F) also provides smooth stress transition between the local buried oxide region 104 and surrounding Si channel area 103a (FIG. 11) of fin 202. Thus, a post implant annealing temperature lower than that in SIMOX for SOI substrate fabrication can result in a robust "defect free" and minimum stress around the Si channel area 103a (FIG. 1). Furthermore, inclusion of one or more of the noted additives N, C, and F can suppress dopants of B, P, diffusion into the local buried oxide region 104 from an adjacent channel area 103a, so that there is provided reduced fluctuations of device parameters.

Figure 10:
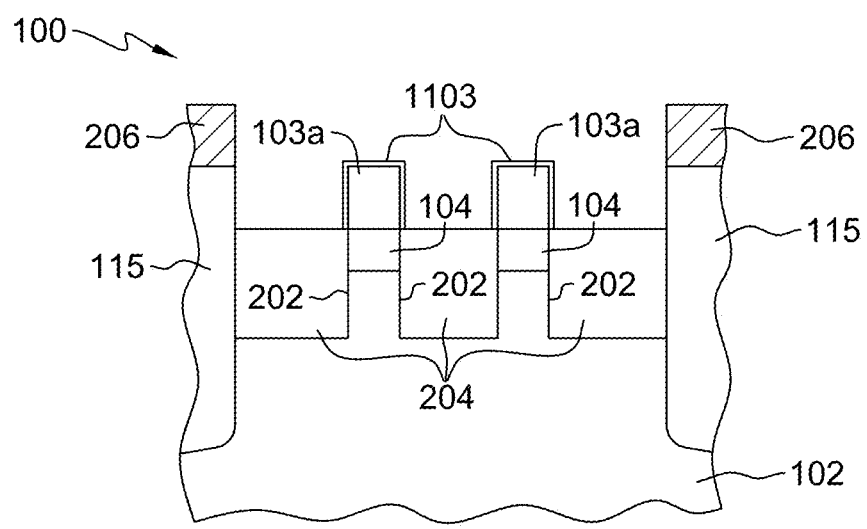

At block 422 (FIG. 4), as depicted in FIG. 10, there can be performed local oxide recess to expose a sidewall of fins 202. The oxide 204 can be recessed deep enough to the level of BOX 104 (e.g., to the middle of BOX level, or at least 10 nm below the top of BOX). In one embodiment, oxide 204 can be recessed to a certain level, the certain level within a range from the top of BOX 104 to a bottom of BOX 104. A thin oxide (e.g., SiO$_2$) layer 1103 (i.e., an interfacial layer) can be grown on a surface of fin 202 as depicted in FIG. 9 after the oxide recess for revealing the fin. The oxide layer 1103 can be used as the gate dielectric in a gate first process or oxide layer 1103 can be used as a dummy gate dielectric in a gate last process. In one embodiment, a gate dielectric of gate 101 can be a multiple layer of thin Si-oxide, Si-oxynitride, and high-k (HfO2) materials to achieve high quality and thin effective thickness and low leakage.

At block 428 (FIG. 4) as depicted in FIG. 11 there can be performed polysilicon deposition. The polysilicon deposition can be performed on an entire wafer. A thickness of the polysilicon layer 2101 can be thick enough so that a gate area 101a is fully filled with polysilicon.

At block 432 (FIG. 4), as depicted in FIG. 12, there can be performed chemical-mechanical planarization (CMP) to planarize the gate stack and insulation layer 206 which can be provided by SiN. The polysilicon gate height can be controlled by a thickness of insulation layer 206, and the gate height can be above the top of fin 202 by between about 20 nm and about 40 nm. Planarization can improve efficiency and accuracy of ensuing processing.

At block 436 (FIG. 4), as depicted in FIG. 13, there can be performed removal of insulation layer 206 which can be provided by SiN. FIG. 13 is a fin lengthwise cross sectional side view of the semiconductor device 100 depicted in the fin widthwise cross sectional views of FIGS. 5-12. The removal can be performed using hot phosphorus acid which is selective to silicon and oxide. In one aspect, only insulation layer 206 is removed. With insulation layer 206 removed (FIG. 12), the non-channel portion of fins 202 are exposed for further process steps to form components, e.g., spacers, source/drain, contacts to complete the FinFET (as a poly-gate process) in accordance with a gate first process. Where a FinFET device 100 is completed using a "gate first" process polysilicon layer 2101 can define a gate electrode 101e (FIG. 14).

Alternatively, at block 440 (FIG. 4) there can be performed completion of a FinFET device 100 by a gate last process (with the poly gate stack to be removed later in process steps). According to a gate last process, a poly-Si layer 2101 can be used as a temporary gate stack to form an offset spacer, followed by optional Halo implantation and extension implantations. Rapid Thermal Analysis (RTA) can be performed and is optional depending on a specific integration scheme used. Source and drain formation can be the same as that in bulk flow with eSiGe (for PFET stress booster), SMT or SiC (for NFET stress booster). There can then be performed Interlayer Dielectric (ILD) formation, metal gate formation, Middle of Line (MOL) formation silicate formation and contact formation.

Further aspects of a FinFET semiconductor device having a local buried oxide region 104 are now described with reference to FIGS. 1-3 and FIGS. 14-15. It is seen with reference to FIGS. 1-3 and FIGS. 14-15 that local buried oxide region 104 can be formed only under the gate 101 and a well controlled channel 103 but not under a source and drain 105 and 107. Such local buried oxide region 104 underneath a defined channel 103 can effectively eliminate or block the leakage current between the source 105 and drain 107 (i.e., similar to the advantage exhibited as in the case of a MOSFET fabricated on SOI substrate, e.g., ETSOI device). The active channel 103 is above the BOX 104 and the active fin height is determined by the energy/dose level of the oxygen implantation. In addition or alternatively the depth of channel 103 can be controlled by one or more of varying a dosage of oxygen ion implantation and the inclusion of zero or more additives with the implantation. Channel 103 can be aligned to gate 101 and local buried oxide region 104 can be aligned to gate 101. Accordingly, local buried oxide region 104 can be aligned to channel 103 and channel 103 can be aligned to local buried oxide region 104.

In the view of FIG. 14 there is depicted a gate 101 provided by a gate stack having gate electrode 101e and gate dielectric 101d. When semiconductor device 100 is fabricated by a gate first process a gate electrode 101e can be provided by polysilicon layer 2101 and gate dielectric 101d can be provided by oxide layer 1103. While gate electrode 101e and gate dielectric 101d are set forth herein in one embodiment as having a single layer each, gate electrode 101e and gate dielectric 101d can include one or more layers. In one example gate electrode 101e can include multiple conducting layers, e.g., TiN, TaN, TiAl, TiC, Al, and W, (e.g., to set the correct "work function" in advanced CMOS technology nodes). Also, the gate dielectric 101d may also be multiple layers of dielectric, e.g., high-k and $SiO_2$, for better capacitive coupling to channel 103 and smaller leakage between the gate electrode 101e and channel 103. The combination of one or more layers of a gate electrode and one or more layers of a gate dielectric can be regarded as a "gate stack". As illustrated in FIG. 14, local buried oxide region 104 can be aligned with gate 101. Gate 101 can be bounded by imaginary vertically extending planes 101p that extend perpendicularly through substrate 102. In one embodiment, local buried oxide region 104 can be formed so that it does not extend lengthwise in either direction beyond the imaginary vertically extending planes 101p. In one embodiment, local buried oxide region 104 can be aligned to gate 101 by having at least a portion thereof within a location delimited by planes 101p. In one embodiment, local buried oxide region 104 can be aligned to gate 101 by being defined within a location delimited by planes 101p and by being absent of a portion that extends external to a location delimited by planes 101p. In one embodiment, local buried oxide region 104 can be aligned to gate 101 by being defined within a location delimited by planes 101p, by being absent of a portion that extends external to a location delimited by planes 101p, and by having a length in common with a length of gate 101. By providing local buried oxide 104 with use of mask 206 to be self aligned to gate area 101a and gate 101 when formed, local buried oxide region is aligned to gate area 101a and gate 101 when formed.

Figure 15:
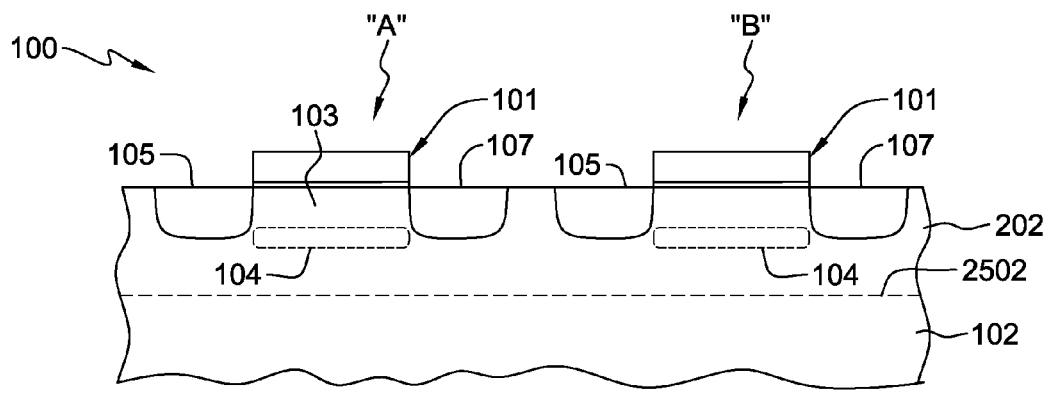
FIG. 15 is a fin lengthwise schematic diagram illustrating a semiconductor device having a plurality of FinFETs.

In one embodiment, channel 103 can be aligned to gate 101 by having at least a portion thereof within a location delimited by planes 101p. In one embodiment, channel 103 can be aligned to gate 101 by being defined within a location delimited by planes 101p and by being absent of a portion that extends external to a location delimited by planes 101p. As depicted in the views of FIGS. 1-15, a gate 101 can be disposed over a fin 202 having defined therein a BOX 104 aligned to gate 101 and a channel 103 aligned to gate 101. In one embodiment, a gate 101 disposed over fin 202 can include a portion within an area delimited by imaginary vertically extending planes 101f (depicted in FIG. 12) that bound sidewalls of fin 202 and extend perpendicularly to substrate 102 (which can be planar) and a portion external to an area delimited by imaginary vertically extending planes 101f bounded by sidewalls of fin 202. In one embodiment, a gate 101 disposed over fin 202 can be entirely defined within an area delimited by imaginary vertically extending planes 101f (depicted in FIG. 12) that bound sidewalls of fin 202 and extend perpendicularly to substrate 102 (which can be planar) and can be absent a portion external to an area delimited by imaginary vertically extending planes 101f bounded by sidewalls of fin 202. In FIGS. 13-15 dotted line 2502 indicates an elevation of a base of fins 202, i.e., the depth to which bulk substrate 102, e.g., Si, can be recessed to define fins 202.

The providing of a local buried oxide region 104 aligned to a gate 101 provides numerous advantages. For example, a field effect channel with such a structure is a thin silicon body partially delimited by the local buried oxide region 104 and thus can achieve the leakage current inhibiting performance on the order of that seen with an extremely thin silicon insulator (ETSOI) device. With source and drain 105 and 107 formed on fins 202 that are formed contiguous with bulk silicon substrate 102 as depicted in the views of FIGS. 1-3 and FIGS. 14-15, the heat generated in logic circuits operating at high frequency can be readily dissipated to bulk silicon substrate 102 to exhibit the same advantages as are exhibited by logic circuits fabricated on a bulk silicon substrate.

In one embodiment, as illustrated in FIG. 14, source and drain 105 and 107 can be formed to be "embedded" source and drain 105 and 107. Referring to the view of FIG. 14, FIG. 14 is a fin lengthwise cross sectional side view illustrating additional aspects of a method set forth with reference to FIGS. 5-13, wherein the embodiment illustrated in the view of FIG. 14 is depicted as including optional halo implants and extension implants. Source 105 and drain 107 can be fabricated as embedded sources and drains including stressors. In one embodiment, embedded source and drain 105 and 107 can be fabricated by recessing of S/D Si, then epi regrowth of SiGe for p-type S/D and SiC for n-type S/D selectively in order to induce stress in the channel 103. In the embodiment of FIG. 14 (as well as in the embodiment depicted in FIG. 3) source 105 includes epitaxial growth formation 105ep for inducing stress in channel 103 and drain 107 includes an epitaxial growth formation 107ep for inducing stress in channel 103.

Further referring to the embodiment depicted in FIG. 14, device 100 is depicted as having halo implants 106, and source and drain extension implants 109 as optional features. As similar to planar CMOS, these optional Halo implants 106 and extension implants 109 for FinFETs are useful in case of short channel length (e.g. <20 nm) for reducing short channel effect. Halo implants through the source/drain can also facilitate adjustment of the threshold voltage (Vt) of the device 100 for implementation of a multi-Vt scheme in logic circuits.

In FIG. 15 there is depicted a semiconductor device 100 having a plurality of FinFETs. Semiconductor device 100 as depicted in FIG. 15 includes a first FinFET at location "A" and a second FinFET at location "B". Each of the first FinFET and second FinFET can be as fabricated according to method in accordance with that described with reference to FIGS. 5-14 except each of the first FinFET at location "A" and the second FinFET at location "B" can be absent of halo implants 106 and source/drain extension implants 109. In one embodiment, FIG. 15 depicts a bulk silicon wafer. In one embodiment, FIG. 15 depicts an integrated circuit (IC).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

The invention claimed is:

1. A semiconductor device comprising:
   a substrate having a fin contiguous with the substrate extending therefrom;
   a local buried oxide region formed in the fin contiguous with the substrate;
   a gate, wherein the local buried oxide region is aligned to the gate so that the local buried oxide region is restricted to a location under the gate;
   a channel defined in the fin above the local buried oxide region, the channel being aligned to the gate and having a first end and a second end;
   a source defined at the first end of the channel; and
   a drain defined at the second end of the channel.

2. The semiconductor device of claim 1, wherein one or more of the source or drain includes an extension.

3. The semiconductor device of claim 1, wherein the source includes means for reducing a short channel effect.

4. The semiconductor device of claim 1, wherein the local buried oxide region is at least partially formed in the fin.

5. The semiconductor device of claim 1, wherein the local buried oxide region is entirely formed in the fin.

6. The semiconductor device of claim 1, wherein the local buried oxide region is partially formed in the fin and partially formed in the substrate.

7. The semiconductor device of claim 1, wherein an area of the substrate below an elevation of a base of the fin includes an area of the local buried oxide region.

8. The semiconductor device of claim 1, wherein the semiconductor device is a silicon wafer having a plurality of fins extending upwardly from the substrate, wherein fins of the plurality of fins have formed therein local buried oxide regions.

9. The semiconductor device of claim 1, wherein the channel is aligned to the gate.

10. The semiconductor device of claim 1, wherein one or more of the source and drain comprises an epitaxial growth formation.

11. The semiconductor device of claim 1, wherein each of the source and drain comprises an epitaxial growth formation.

12. The semiconductor device of claim 1, wherein the source includes means for inducing stress in the channel.

13. The semiconductor device of claim 1, wherein the fin extends contiguously from the substrate.

14. The semiconductor device of claim 1, wherein the source includes an extension.

15. The semiconductor device of claim 1, wherein the local buried oxide region is entirely formed in the fin.

16. The semiconductor device of claim 1, wherein the local buried oxide region is partially formed in the fin and partially formed in the substrate.

17. The semiconductor device of claim 1, wherein the fin extends contiguously from the substrate.

18. The semiconductor device of claim 1, wherein the local buried oxide region is entirely formed in the fin.

19. A semiconductor device comprising:
    a substrate having a fin contiguous with the substrate extending therefrom;
    a local buried oxide region;
    a gate, wherein the local buried oxide region is aligned to the gate;
    a channel defined in the fin contiguous with the substrate above the local buried oxide region, the channel being aligned to the gate and having a first end and a second end;
    a source defined at the first end of the channel; and
    a drain defined at the second end of the channel, wherein the local buried oxide region is at least partially formed in the fin, and wherein the local buried oxide region is formed under the gate but not under the source or drain.

20. A semiconductor device comprising:
    a substrate having a fin contiguous with the substrate extending from the substrate;
    a local buried oxide region formed in the fin contiguous with the substrate;
    a gate, wherein the local buried oxide region is aligned to the gate;
    a channel defined in the fin above the local buried oxide region, the channel being aligned to the gate and having a first end and a second end;
    a source defined at the first end of the channel; and
    a drain defined at the second end of the channel, wherein the local buried oxide region is formed under the gate but not under the source or drain.

* * * * *